United States Patent [19]

Kozono

[11] Patent Number: 5,399,904

[45] Date of Patent: Mar. 21, 1995

[54] ARRAY TYPE SEMICONDUCTOR DEVICE HAVING INSULATING CIRCUIT BOARD

[75] Inventor: Hiroyuki Kozono, Oomiya, Japan

[73] Assignee: Kabushiki Kaisha Toshiba, Kawasaki, Japan

[21] Appl. No.: 145,528

[22] Filed: Nov. 4, 1993

[30] Foreign Application Priority Data

Nov. 5, 1992 [JP] Japan .................................. 4-295811

[51] Int. Cl.⁶ ...................... H01L 23/48; H01L 29/44
[52] U.S. Cl. ................................ 257/666; 257/676;
257/784; 361/767; 361/783; 361/813
[58] Field of Search ............... 257/666, 668, 676, 784;
361/767, 777, 783, 895, 813

[56] References Cited

U.S. PATENT DOCUMENTS

| | | | |
|---|---|---|---|
| 4,903,114 | 2/1990 | Aoki et al. | 257/666 |
| 5,053,852 | 10/1991 | Biswas et al. | 257/676 |
| 5,168,368 | 12/1992 | Gow, 3rd et al. | 257/666 |
| 5,220,195 | 6/1993 | McShane et al. | 257/666 |
| 5,227,662 | 7/1993 | Ohno et al. | 257/666 |
| 5,264,730 | 11/1993 | Matsuzaki | 257/666 |

Primary Examiner—Rolf Hille
Assistant Examiner—David Ostrowski
Attorney, Agent, or Firm—Finnegan, Henderson, Farabow, Garrett & Dunner

[57] ABSTRACT

There is provided a semiconductor device comprising a lead frame including an island and a plurality of leads, a semiconductor chip, mounted on the island, having bonding pads, the semiconductor chip further including circuit blocks connected to bonding pads, and an insulating circuit substrate, mounted on the island, including a plurality of conductive layers each having connection pads. In the structure, the bonding pads are connected to the connection pads to provide electrical connections among the circuit blocks.

10 Claims, 3 Drawing Sheets

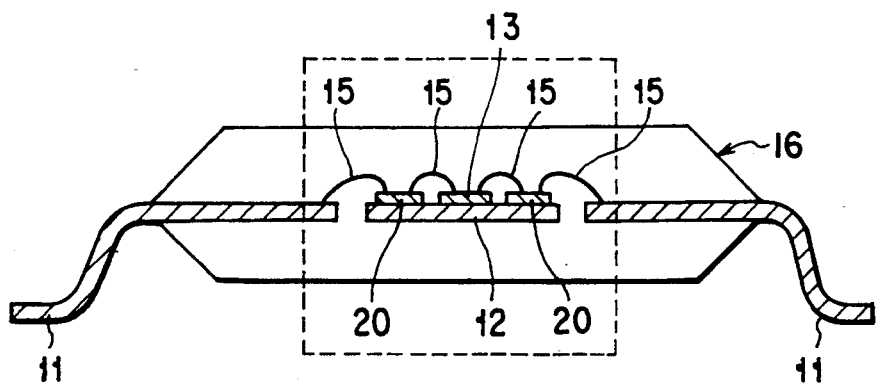
F I G. 1
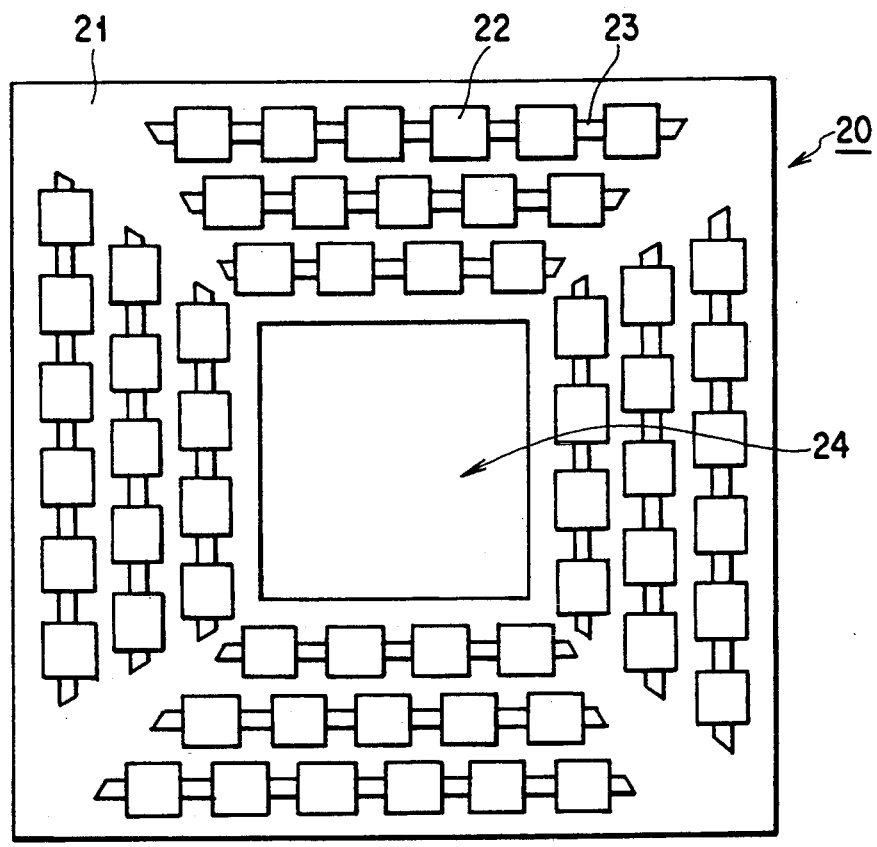
F I G. 2

5,399,904

ARRAY TYPE SEMICONDUCTOR DEVICE HAVING INSULATING CIRCUIT BOARD

BACKGROUND OF THE INVENTION

1. Field of the Invention

The present invention relates to a semiconductor device, more particularly, to a semiconductor device having an array type semiconductor chip.

2. Description of the Related Art

It has been necessary that various kinds of array type semiconductor devices are developed although the production of them is not so many. Therefore, it has been required to design such semiconductor devices during a short period of time in low cost. Particularly, it must be carried out to perform a layout design that includes an arrangement of circuit blocks, interconnections among circuit blocks, etc.

A conventional array type semiconductor device will be described with reference to FIGS. 4 and 5. As shown in FIG. 4, the device comprises an array type semiconductor chip 51 mounted on an island 53, a plurality of leads 52 connected to external terminals, bonding wires 54 for connecting electrode pads (not shown), provided on the surface of the chip 51, to the leads 52, respectively, and a resin layer 55 for encapsulating the components 51, 52, 53, and 54. The leads 52 and the island 53 are unitarily formed by a metal plate.

FIG. 5 is a plan view showing that portion of the array type semiconductor chip 51 enclosed by broken lines in FIG. 4. As shown in FIG. 5, a plurality of electrode pads 56 are provided on the peripheral portions of the chip 51. The electrode pads 56 are connected to the leads 52 by the bonding wires 54, respectively.

The array type semiconductor chip 51 will be described in more detail. The chip 51 includes a plurality of circuit blocks, among which are connected by wiring layers. For designing the chip, the circuit blocks are arranged in the optimum positions the chip 51, and then wiring patterns for connecting the circuit blocks are provided.

For performing the arrangement of the circuit blocks and the layout design of the wiring layers, it is desirable that the wiring patterns are included in several kinds of wiring patterns. However, it is necessary to newly produce wiring patterns in various kinds of chips produced in small quantities. Further, for designing the wiring patterns, it is necessary to decrease the wiring area occupying the greater part of the chip size, thereby reducing the chip size. However, the wiring patterns will be complicated with increasing the integration density. Therefore, since the design period of the wiring pattern is increased, the cost required for designing the wiring patterns may be increased, thereby further increasing the cost for the array type semiconductor device.

SUMMARY OF THE INVENTION

It is an object of the present invention to provide a semiconductor module having an improved wiring structure.

It is another object of the present invention to provide a semiconductor module including a semiconductor chip and a wiring circuit board.

According to one aspect of the present invention, there is provided a semiconductor device comprising a lead frame including an island and a plurality of leads, a semiconductor chip, mounted on the island, having bonding pads, including circuit blocks, and an insulating circuit board, mounted on the island, including a plurality of conductive layers each having connection pads. In the structure, the bonding pads are connected to the connection pads to provide electrical connections among the circuit blocks.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1 is a cross-sectional view showing an array type semiconductor device according to the present invention;

FIG. 2 is a plan view schematically showing an insulating circuit board;

DETAILED DESCRIPTION OF THE PREFERRED EMBODIMENT

Figure 3:
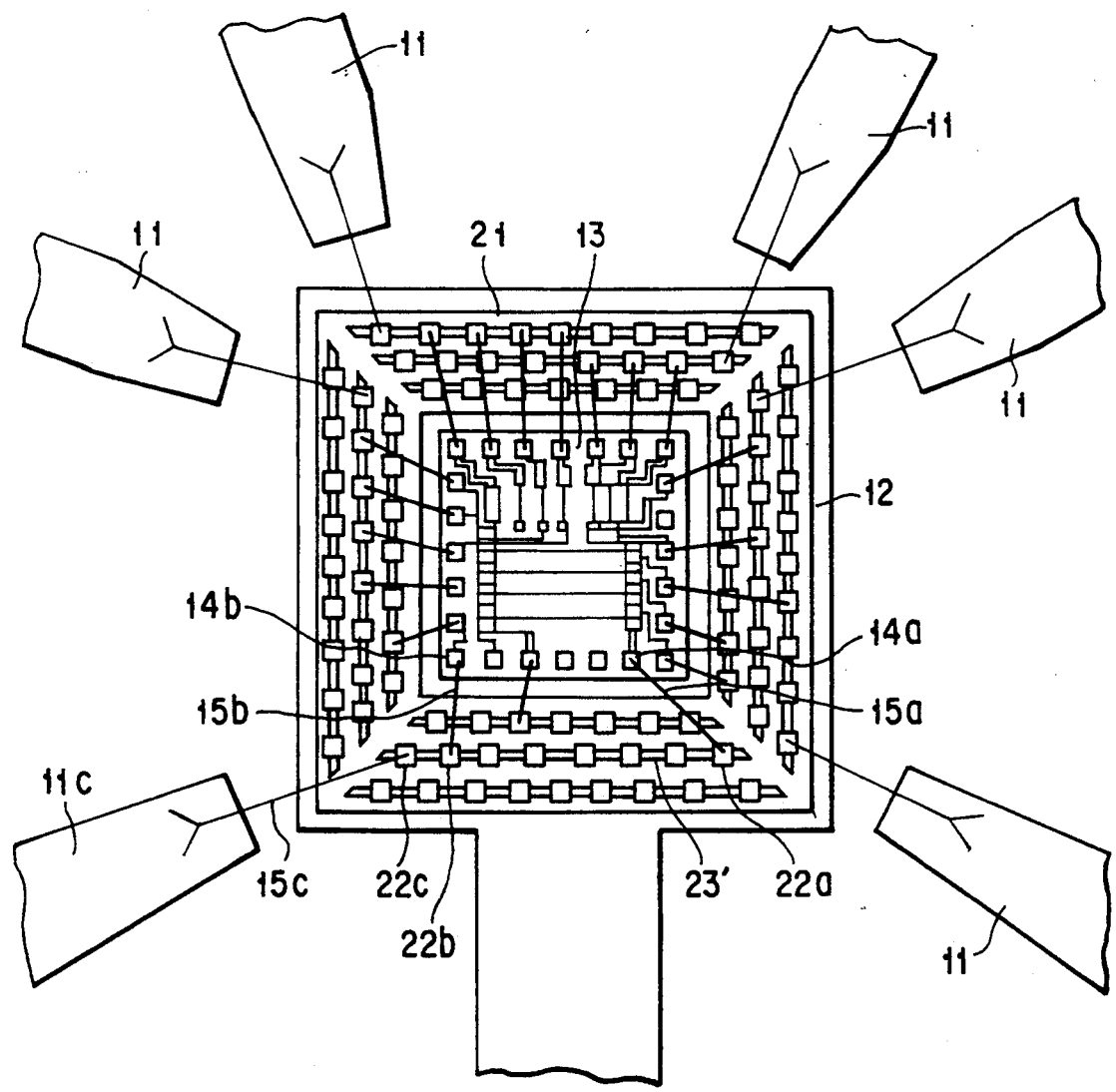
FIG. 3 is a plan view schematically showing the part enclosed by broken lines in FIG. 1.
Figure 4:
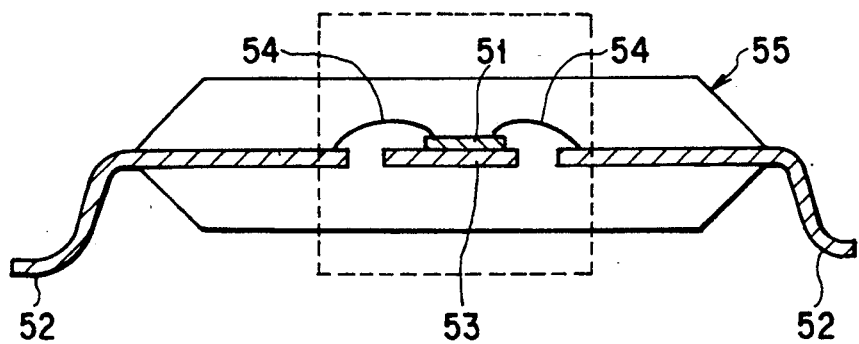
FIG. 4 is a cross-sectional view of the conventional array type semiconductor device.
Figure 5:
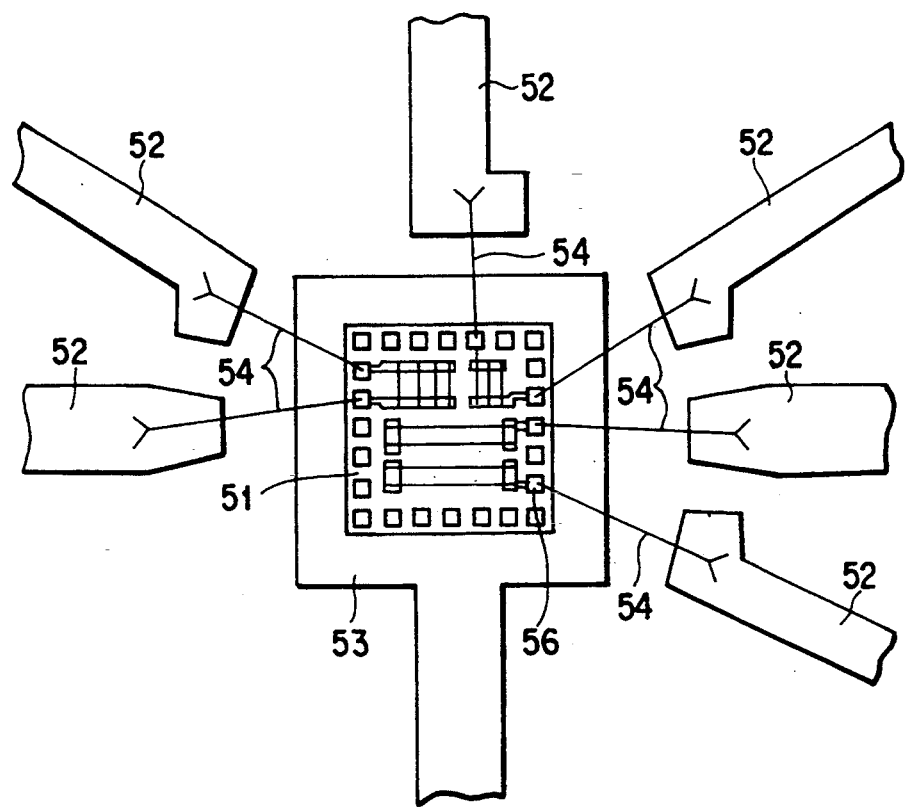
FIG. 5 is a plan view schematically showing the part enclosed by broken lines in FIG. 4.

One embodiment of an array type semiconductor device according to the present invention will be described with reference to FIGS. 1 to 3. As shown in FIG. 1, the array type semiconductor device comprises an array type semiconductor chip 13 mounted on an island 12, an insulating circuit board 20 mounted on the island 12 and provided so as to surround the chip 13, a plurality of leads 11 unitarily formed with the island 12, bonding wires 15 electrically connecting the chip 13 to the board 20, and further connecting the board 20 to the leads 11, a resin layer 16 encapsulating the island 12, the chip 13, the board 20, and the inner portions of the leads 11.

The insulating circuit board 20 will be described in detail with reference to FIG. 2. The board 20 includes an insulating substrate 21 having an aperture 24, a plurality of connection pads (connection terminals) 22, and a plurality of conductive layers (metal layers) 23 arranged in rows each and connecting connection pads 22. The apertures 24 is provided at the center of the insulating substrate 21. It is large enough to insert the semiconductor chip 13. The conductive layers 23 are arranged in rows so as to be in parallel with one another, along each side of the insulating substrate 21. The connection pads 22 have a configuration suitable for a wire bonding.

The connection between the semiconductor chip 13 and the insulating circuit board 20 will be explained in detail with reference to FIG. 3. The semiconductor chip 13 has a plurality of circuit blocks, each having a plurality of array pads (array terminals). The array pads serve as connection nodes among the circuit blocks. The semiconductor chip 13 has a plurality of bonding pads 14 along peripheral portions.

A first array pad (not shown) provided on the semiconductor chip 13 is connected to a first electrode pad 14a by a conductive layer. The first electrode pad 14a is connected by a bonding wire 15a to a first connection pad 22a provided on the insulating circuit board 20.

Similarly, a second electrode pad 14b connected to a second array pad (not shown) is connected to a second connection pad 22b by a bonding wire 15b. A third connection pad 22c is connected to a lead 11c by a bonding wire 15c. The first connection pad 22a, the second connection pad 22b, and the third connection pad 22c are electrically connected by a conductive layer 23'. As a result, the first array pad connected to the first connection pad 22a can be electrically connected to the second array pad connected to the second connection pad 22b. The first and second array pads can be also electrically connected to the leads 11.

As described above, the first and second array pads are electrically connected to one another through the insulating circuit board 20 (more precisely, through the connection pads 22 provided on the insulating substrate 21). Therefore, it is possible to electrically connect circuit blocks, formed in the chip 13, to one another, using the connection pads of the wiring circuit board arranged in rows.

It is further understood by those skilled in the art that the foregoing description is only of the preferred embodiments and that various changes and modifications may be mode in the invention without departing from the spirit and scope thereof.

What is claimed is:

1. A semiconductor device comprising:
   a lead frame including an island and a plurality of leads;
   a semiconductor chip mounted on said island and having bonding pads, said semiconductor chip further including circuit blocks connected to said bonding pads;
   an insulating circuit board with four sides including a plurality of conductive layers each having connection pads, said insulating circuit board having an opening and being mounted on said island so as to surround said semiconductor chip through said opening;
   said plurality of conductive layers being arranged in rows along each of said four sides so as to be electrically separated from one another;
   a first group of bonding wires for connecting some of said bonding pads to some of said connection pads;
   a second group of bonding wires for connecting some of said connection pads to some of said plurality of leads; and
   said bonding pads being connected to said connection pads to substantially provide electrical connections among said circuit blocks.

2. The semiconductor device according to claim 1, wherein said semiconductor chip is rectangular.

3. The semiconductor device according to claim 1, wherein said opening is rectangular.

4. The semiconductor device according to claim 1, wherein some of said connection pads are connected to said plurality of leads by bonding wires.

5. The semiconductor device according to claim 1, wherein said bonding pads are connected to some of said connection pads by bonding wires.

6. A semiconductor device comprising:
   a lead frame having an island and a plurality of leads;
   a semiconductor chip mounted on said island and having first and second bonding pads, said semiconductor chip further including first and second circuit blocks respectively connected electrically to said first and second bonding pads;
   an insulating circuit board having a top surface and an opening and being mounted on said island so that the opening surrounds said semiconductor chip;
   said insulating circuit board including a conductive pattern contained completely on said top surface, said conductive pattern having first, second, and third connection pads electrically connected to each other;
   first and second bonding wires respectively connecting said first bonding pad to said first connection pad and said second bonding pad to said second connection pad so as to provide an electrical connection between said first and second circuit blocks; and
   a third bonding wire connecting said third connection pad to one of said plurality of leads so as to electrically connect said semiconductor chip to said lead frame.

7. The semiconductor device according to claim 6, wherein said semiconductor chip includes a plurality in excess of two bonding pads and a plurality in excess of two circuit blocks connected to said bonding pads;
   said insulating circuit includes a plurality of electrically isolated conductive patterns each having a plurality in excess of three connection pads electrically connected to each other;
   a first set of bonding wires connecting some of said bonding pads to some of said connection pads to substantially provide electrical connections among said circuit blocks; and
   a second set of bonding wires connecting some of said connection pads to some of said plurality of leads to electrically connect said semiconductor chip to said lead frame.

8. The semiconductor device according to claim 7, wherein said insulating circuit board includes four sides surrounding said semiconductor chip.

9. The semiconductor device according to claim 8, wherein the plurality of conductive patterns are arranged along each of said four sides of said insulating circuit board.

10. The semiconductor device according to claim 9, wherein three conductive patterns are arranged in parallel along each of said four sides of said insulating circuit board.

* * * * *